(12) United States Patent
Li

(10) Patent No.: US 9,362,138 B2
(45) Date of Patent: Jun. 7, 2016

(54) IC PACKAGE AND METHOD FOR MANUFACTURING THE SAME

(75) Inventor: Tunglok Li, Hong Kong (CN)

(73) Assignee: Kaixin, Inc., Tseun Wan (CN)

( * ) Notice: Subject to any disclaimer, the term of this patent is extended or adjusted under 35 U.S.C. 154(b) by 89 days.

(21) Appl. No.: 13/389,935

(22) PCT Filed: Nov. 26, 2009

(86) PCT No.: PCT/CN2009/001320
§ 371 (c)(1),
(2), (4) Date: Apr. 2, 2012

(87) PCT Pub. No.: WO2011/026261
PCT Pub. Date: Mar. 10, 2011

(65) Prior Publication Data
US 2012/0181680 A1  Jul. 19, 2012

Related U.S. Application Data

(60) Provisional application No. 61/239,421, filed on Sep. 2, 2009.

(51) Int. Cl.
*H01L 21/00* (2006.01)
*H01L 21/48* (2006.01)
(Continued)

(52) U.S. Cl.
CPC ........ *H01L 21/4832* (2013.01); *H01L 23/4951* (2013.01); *H01L 23/49582* (2013.01); *H01L 24/29* (2013.01); *H01L 24/32* (2013.01); *H01L 24/48* (2013.01); *H01L 2224/32245* (2013.01); *H01L 2224/48091* (2013.01); *H01L 2224/48247* (2013.01); *H01L 2224/48257* (2013.01); *H01L 2224/73265* (2013.01); *H01L 2924/01029* (2013.01); *H01L 2924/01078* (2013.01);
(Continued)

(58) Field of Classification Search
None
See application file for complete search history.

(56) References Cited

U.S. PATENT DOCUMENTS 5,468,994 A  11/1995  Pendse
5,661,337 A  8/1997  Manteghi
(Continued)

FOREIGN PATENT DOCUMENTS

CN  1222252  7/1999
CN  100385641  2/2006
(Continued)

OTHER PUBLICATIONS

U.S. Appl. No. 12/816,974, Tung Lok Li.
(Continued)

*Primary Examiner* — Matthew Landau
*Assistant Examiner* — Priya Rampersaud
(74) *Attorney, Agent, or Firm* — Winstead PC

(57) ABSTRACT

An IC package is provided. The IC package comprises a leadframe comprising a metal strip (222) partially etched on a first side. The leadframe may be configured for an IC chip to be mounted thereon and for a plurality of bonding areas (218) to be electrically coupled to the leadframe and the IC chip. The IC chip, the bonding areas, and a portion of the metal leadframe are covered with an encapsulation compound, with a plurality of contact pads (206) protruding from the bottom surface of the leadframe. The bottom surface of the leadframe may be etched one or more times during the manufacturing process to reduce the depth of the undercutting. A method for manufacturing an IC package is also provided.

18 Claims, 11 Drawing Sheets

(51) Int. Cl.
*H01L 23/495* (2006.01)
*H01L 23/00* (2006.01)

(52) U.S. Cl.
CPC . *H01L2924/01079* (2013.01); *H01L 2924/181* (2013.01)

(56) References Cited

U.S. PATENT DOCUMENTS

| | | | |
|---|---|---|---|
| 6,084,292 A | 7/2000 | Shinohara | |
| 6,191,494 B1 | 2/2001 | Ooyama et al. | |
| 6,229,200 B1 | 5/2001 | Mclellan et al. | |
| 6,238,952 B1 | 5/2001 | Lin | |
| 6,242,281 B1 | 6/2001 | Mclellan et al. | |
| 6,294,100 B1 | 9/2001 | Fan et al. | |
| 6,306,685 B1* | 10/2001 | Liu et al. | 438/121 |
| 6,319,749 B1 | 11/2001 | Shigeta et al. | |
| 6,372,539 B1 | 4/2002 | Bayan et al. | |
| 6,465,734 B2 | 10/2002 | Yamada et al. | |
| 6,498,099 B1 | 12/2002 | McLellan et al. | |
| 6,498,393 B2* | 12/2002 | Fujimoto | H01L 21/4832 257/666 |
| 6,545,347 B2 | 4/2003 | McClellan | |
| 6,548,328 B1 | 4/2003 | Sakamoto et al. | |
| 6,563,209 B1 | 5/2003 | Takahashi | |
| 6,585,905 B1 | 7/2003 | Fan et al. | |
| 6,642,082 B2 | 11/2003 | Kawai et al. | |
| 6,664,615 B1 | 12/2003 | Bayan et al. | |
| 6,670,222 B1 | 12/2003 | Brodsky | |
| 6,700,188 B2 | 3/2004 | Lin | |
| 6,777,265 B2 | 8/2004 | Islam et al. | |
| 6,812,552 B2 | 11/2004 | Islam et al. | |
| 6,940,154 B2 | 9/2005 | Pedron et al. | |
| 6,967,125 B2 | 11/2005 | Fee et al. | |
| 6,975,022 B2 | 12/2005 | Sakamoto et al. | |
| 6,995,458 B1 | 2/2006 | Hashemi | |
| 7,049,177 B1 | 5/2006 | Fan et al. | |
| 7,049,696 B2 | 5/2006 | Kubo | |
| 7,064,419 B1 | 6/2006 | Bayan et al. | |
| 7,095,096 B1 | 8/2006 | Mostafazadeh | |
| 7,129,116 B2 | 10/2006 | Islam et al. | |
| 7,173,321 B2 | 2/2007 | Kim | |
| 7,176,582 B2 | 2/2007 | Kloen et al. | |
| 7,186,588 B1 | 3/2007 | Bayan et al. | |
| 7,217,991 B1 | 5/2007 | Davis | |
| 7,247,526 B1 | 7/2007 | Fan et al. | |
| 7,270,867 B1 | 9/2007 | Kwan et al. | |
| 7,410,830 B1 | 8/2008 | Fan et al. | |
| 7,411,289 B1 | 8/2008 | McLellan et al. | |
| 7,419,855 B1 | 9/2008 | Lee et al. | |
| 7,541,668 B2 | 6/2009 | Choi | |
| 7,622,332 B2 | 11/2009 | Islam et al. | |
| 7,671,452 B1 | 3/2010 | Bayan et al. | |
| 7,749,809 B2 | 7/2010 | How et al. | |
| 7,786,557 B2 | 8/2010 | Hsieh et al. | |
| 7,880,282 B2 | 2/2011 | Holland | |
| 7,888,179 B2 | 2/2011 | Kagaya et al. | |
| 8,072,053 B2* | 12/2011 | Li | H01L 21/78 257/675 |
| 2001/0026014 A1 | 10/2001 | Sakamoto et al. | |
| 2003/0003627 A1 | 1/2003 | Yamaguchi et al. | |
| 2003/0207498 A1 | 11/2003 | Islam et al. | |
| 2004/0251557 A1 | 12/2004 | Kee | |
| 2005/0026386 A1* | 2/2005 | Lee | H01L 21/4832 438/411 |
| 2006/0267164 A1 | 11/2006 | Chung et al. | |
| 2007/0034993 A1* | 2/2007 | Lange | 257/666 |
| 2007/0052076 A1 | 3/2007 | Ramos et al. | |
| 2007/0085199 A1 | 4/2007 | Ong et al. | |
| 2008/0012110 A1* | 1/2008 | Chong et al. | 257/686 |
| 2008/0258273 A1 | 10/2008 | Liang et al. | |
| 2008/0258278 A1 | 10/2008 | Ramos et al. | |
| 2008/0285251 A1 | 11/2008 | Liang et al. | |
| 2008/0290486 A1 | 11/2008 | Chen et al. | |
| 2008/0315412 A1 | 12/2008 | Liang et al. | |
| 2009/0194854 A1* | 8/2009 | Tan et al. | 257/666 |
| 2010/0044884 A1* | 2/2010 | Zbrzezny et al. | 257/779 |
| 2010/0224971 A1 | 9/2010 | Li | |

FOREIGN PATENT DOCUMENTS

| | | |
|---|---|---|
| CN | 1929102 | 3/2007 |
| EP | 0700086 A2 | 3/1996 |
| JP | 2001024135 A | 1/2001 |
| JP | 2005303039 A | 10/2005 |
| JP | 2005317998 A | 11/2005 |
| JP | 2006128734 | 5/2006 |
| JP | 2007048981 A | 2/2007 |
| WO | WO-03085731 A1 | 10/2003 |

OTHER PUBLICATIONS

Xie, Shaojun, "International Search Report" for PCT/CN2009/072030, as mailed Dec. 10, 2009, 4 pages.
Zhi, Yue, "International Search Report", for PCT/CN2009/001320 as mailed Jun. 10, 2010 (4 pages).
Li, Qinghui, "International Search Report", for PCT/CN2010/000239 as mailed Jun. 3, 2010 (3 pages).
U.S. Appl. No. 13/262,709, Li.
U.S. Appl. No. 13/287,502, Li.

* cited by examiner

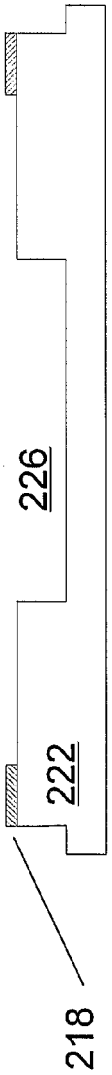
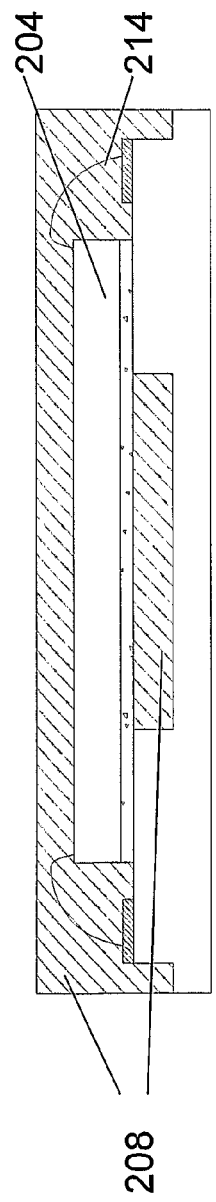
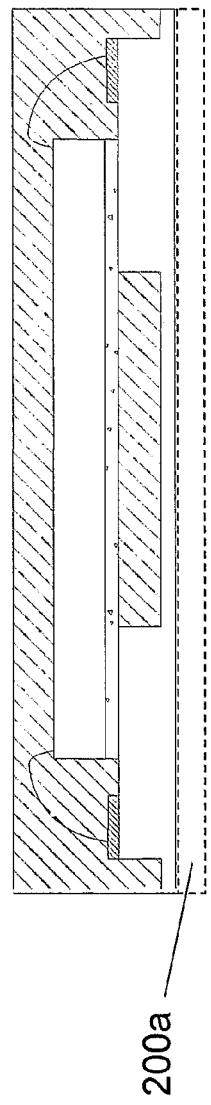
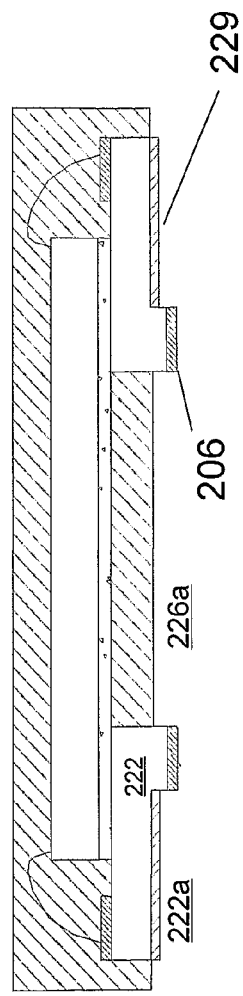
FIG. 2A
FIG. 2B
FIG. 2C
FIG. 2D
FIG. 2E

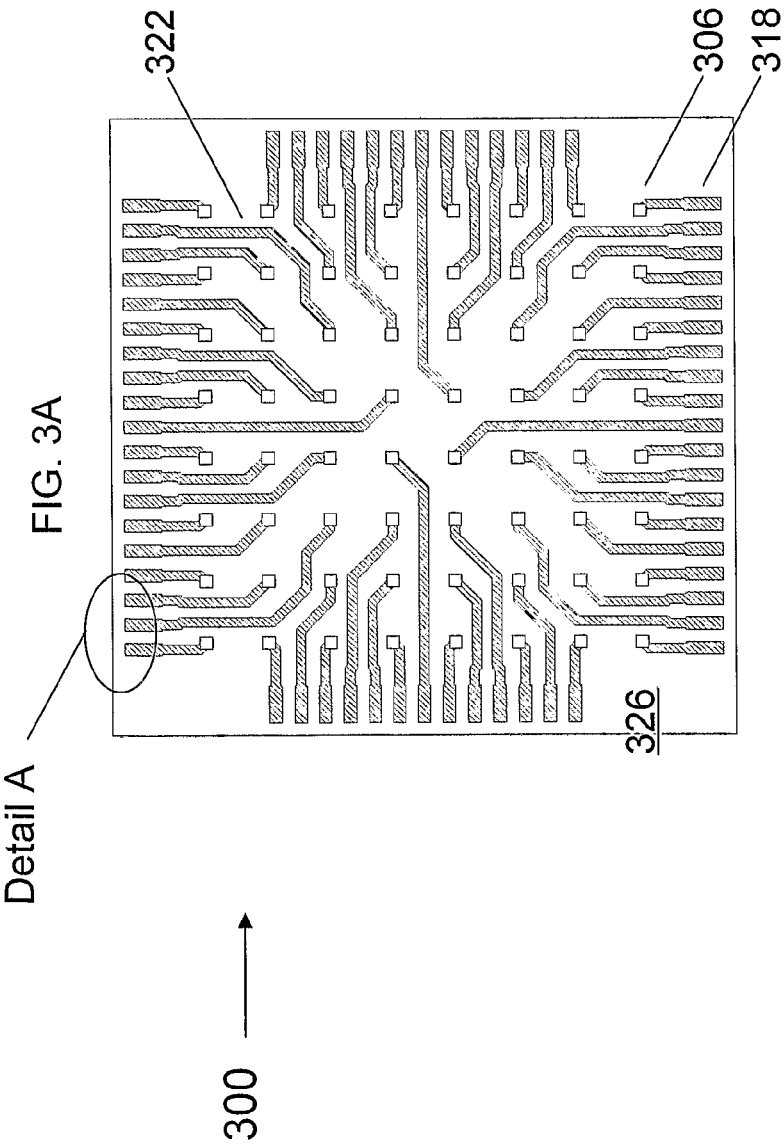
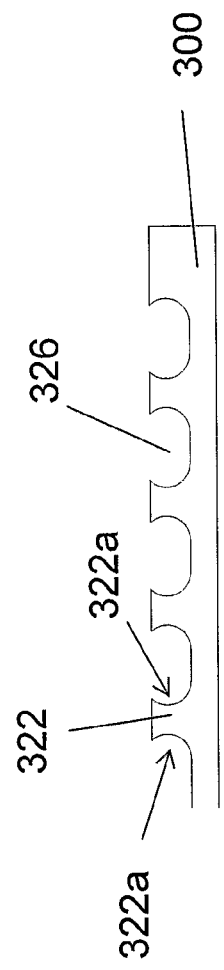
FIG. 3A
FIG. 3B

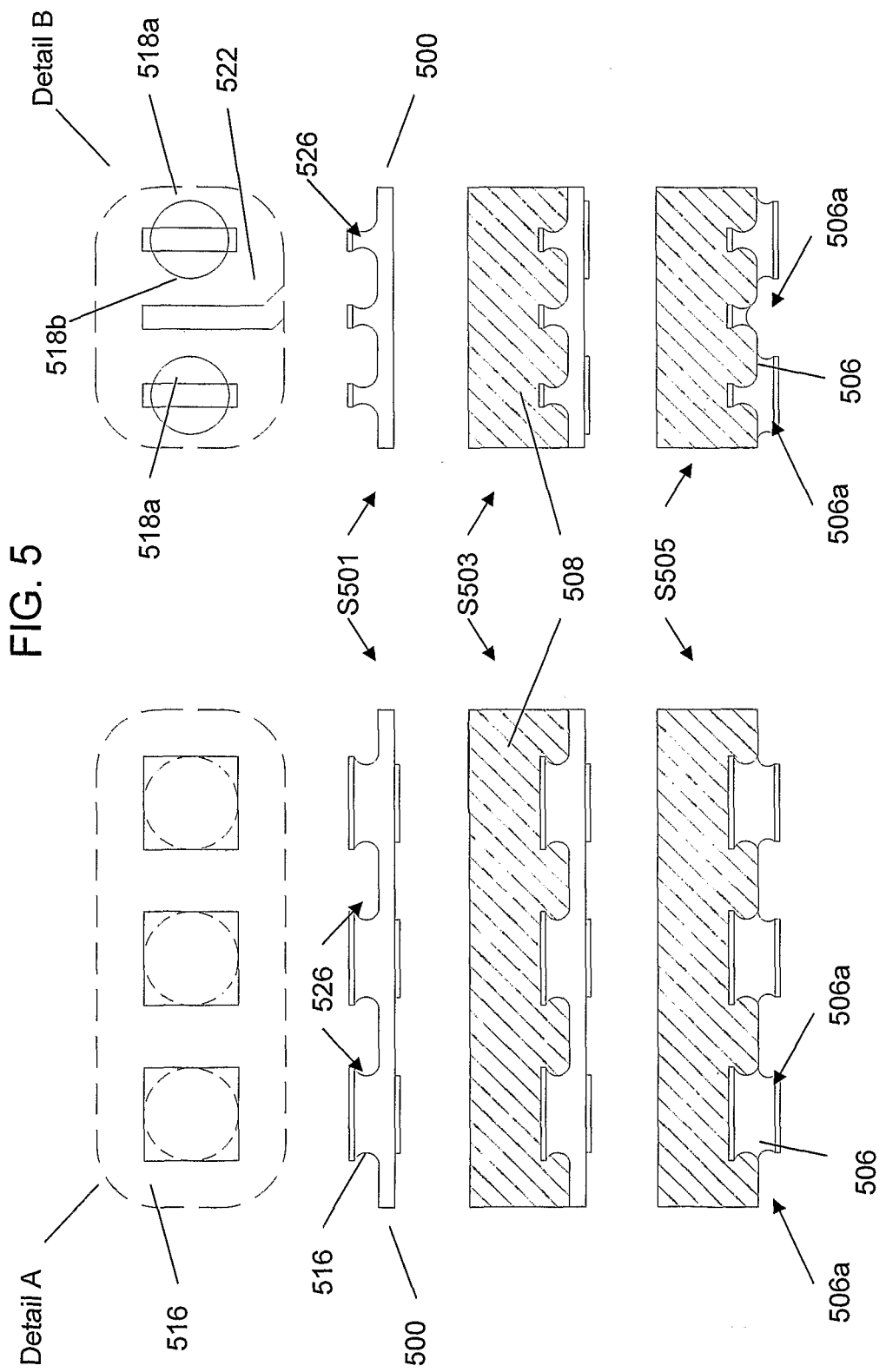

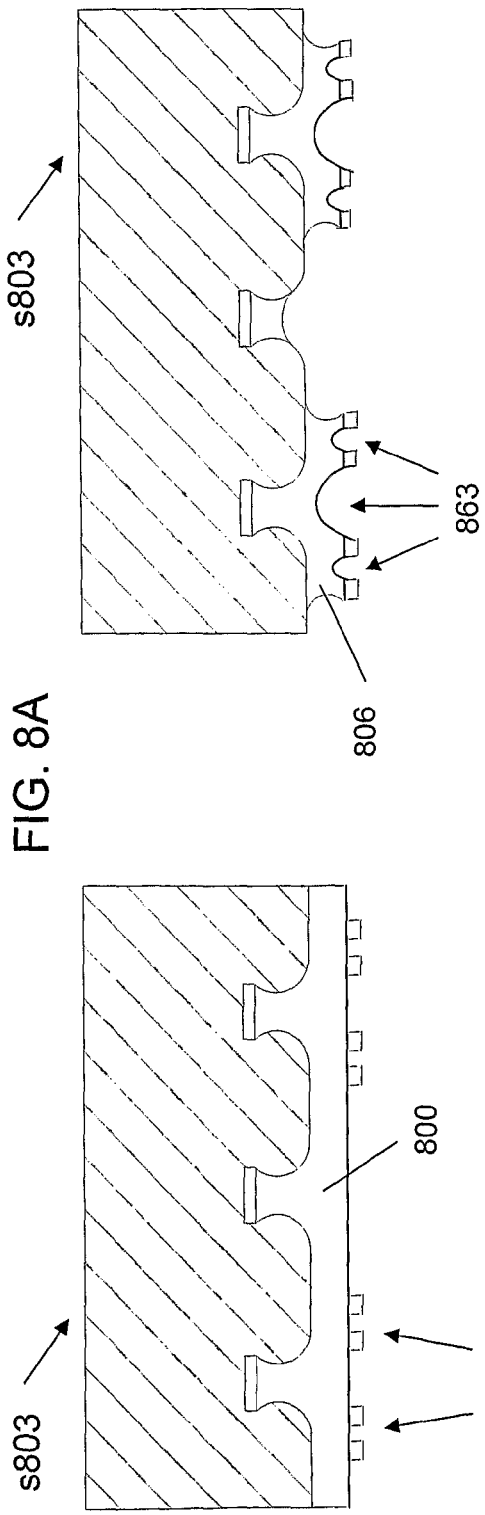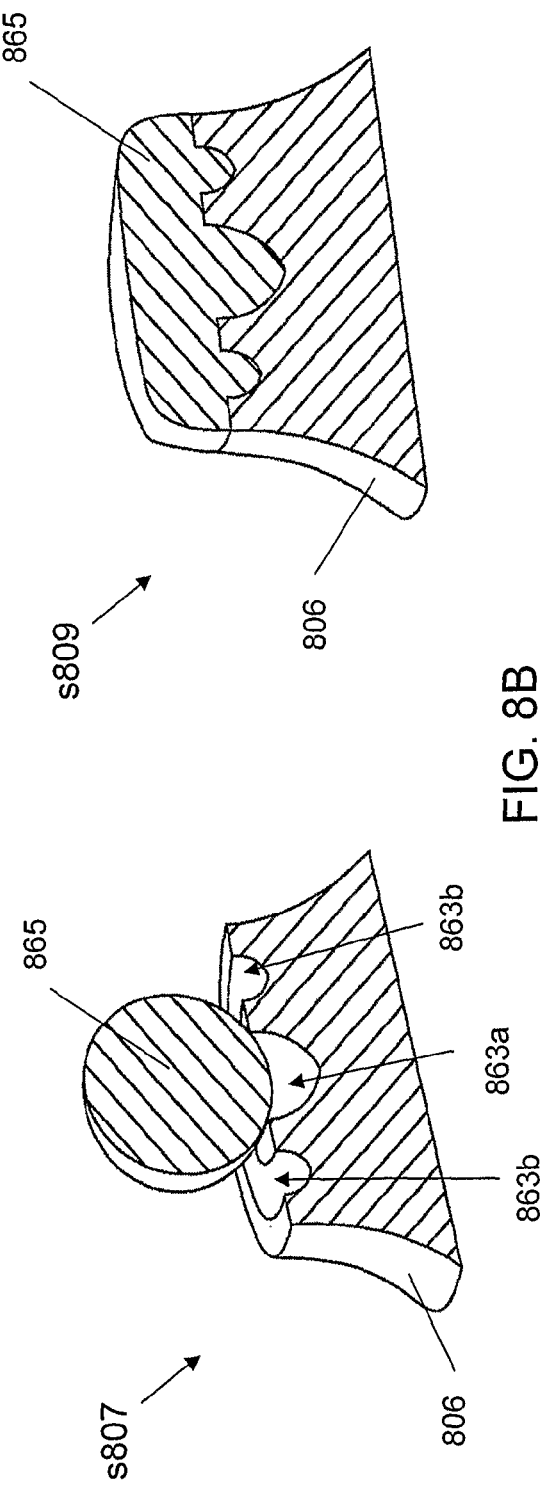
FIG. 8A
FIG. 8B

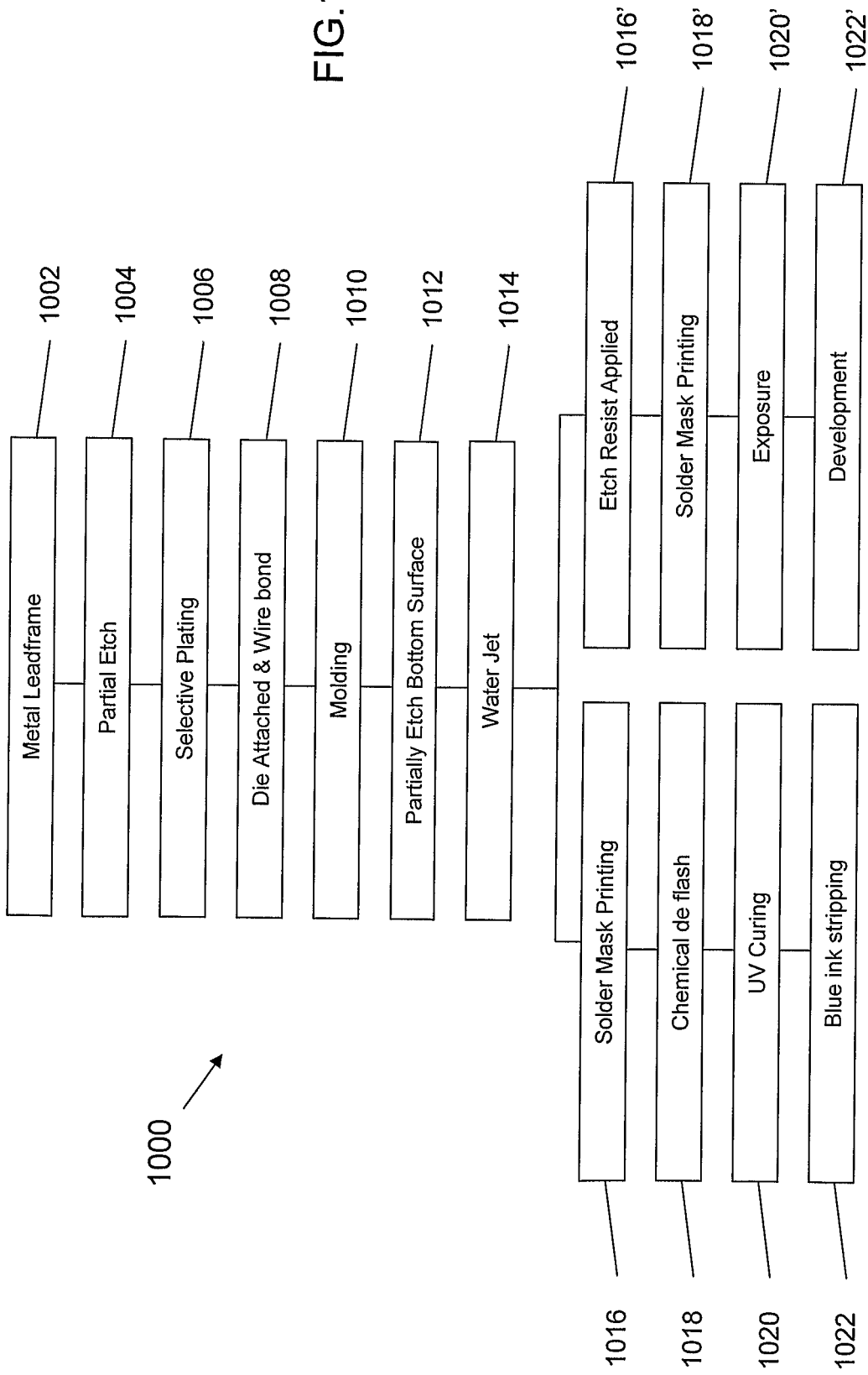

IC PACKAGE AND METHOD FOR MANUFACTURING THE SAME

CROSS-REFERENCE TO RELATED APPLICATIONS

This patent application claims priority to U.S. Provisional Patent Application Ser. No. 61/239,421, filed 2 Sep. 2009, which is hereby incorporated by reference.

BACKGROUND

1. Technical Field

This patent application relates generally to integrated circuit (IC) packaging technology and, in particular, but not by way of limitation, to systems and method for patterning IC package leadframes.

2. Background

IC packaging is one of the final stages involved in the fabrication of IC devices. During IC packaging, one or more IC chips are mounted on a package substrate, connected to electrical contacts, and then coated with an encapsulation material comprising an electrical insulator such as epoxy or silicone molding compound. The resulting IC package may then be mounted onto a printed circuit board (PCB) and/or connected to other electrical components.

Oftentimes, leadless IC packages may include electrical contacts rather than external leads, where the electrical contacts are covered on top by an encapsulating material and are exposed on the bottom of the IC package so they can be connected to electrical components located beneath the IC package. Oftentimes, using a metal leadframe to form part of the IC package may be more cost effective than using a laminated board or tape material because, for example, more cost effective materials may be used, such as copper, nickel, or other metals or metal alloys, and use of such materials may allow more cost effective manufacturing processes to be employed, such as stamping or etching rather than multi-step laminate processes.

In the past, leadless IC packages have been limited in that the maximum number of terminals that can be utilized to pass electrical signals to and from the I/O ports of the IC chip is limited to the number of terminals that can be located around the perimeter of the Die-Attach Pad (DAP). Attempts have been made to increase the number of terminals available for electrical connection with the I/O ports of the IC chip, including decreasing the distance between the terminals in order to fit more terminals around the perimeter of the DAP and increasing the number of rows of terminals disposed around the perimeter of the DAP. However, increasing the number of rows of terminals requires either decreasing the size of the IC chip or increasing the size of the IC package. Additionally, the amount the distance between the terminals can be reduced is limited to the minimum distance between connection points on the PCB, which is relatively large.

SUMMARY

Various embodiments disclosed in this application contemplate

The above summary of the invention is not intended to represent each embodiment or every aspect of the present invention.

BRIEF DESCRIPTION OF THE DRAWINGS

A more complete understanding of various embodiments of the present invention may be obtained by reference to the following Detailed Description when taken in conjunction with the accompanying Drawings, wherein:

FIGS. 2A-E illustrate aspects of an embodiment of a leadless IC package at various stages of a manufacturing process;

FIGS. 3A-B are two views of an embodiment of a metal leadframe having a plurality of metal traces formed on a top surface thereof;

FIG. 5 illustrates Details A and B of the embodiment of the leadframe of FIG. 4A at various stages of a manufacturing process;

FIGS. 8A-B illustrate side views of various aspects of an embodiment of an IC package at various stages of a manufacturing process for patterning a contact pad;

FIG. 10 is a flowchart of various embodiments of a process for manufacturing an IC package.

DETAILED DESCRIPTION OF ILLUSTRATIVE EMBODIMENTS

Various embodiments of the present invention will now be described more fully with reference to the accompanying drawings. The invention may, however, be embodied in many different forms and should not be construed as limited to the embodiments set forth herein; rather, the embodiments are provided so that this disclosure will be thorough and complete, and will fully convey the scope of the invention to those skilled in the art.

Figure 1:
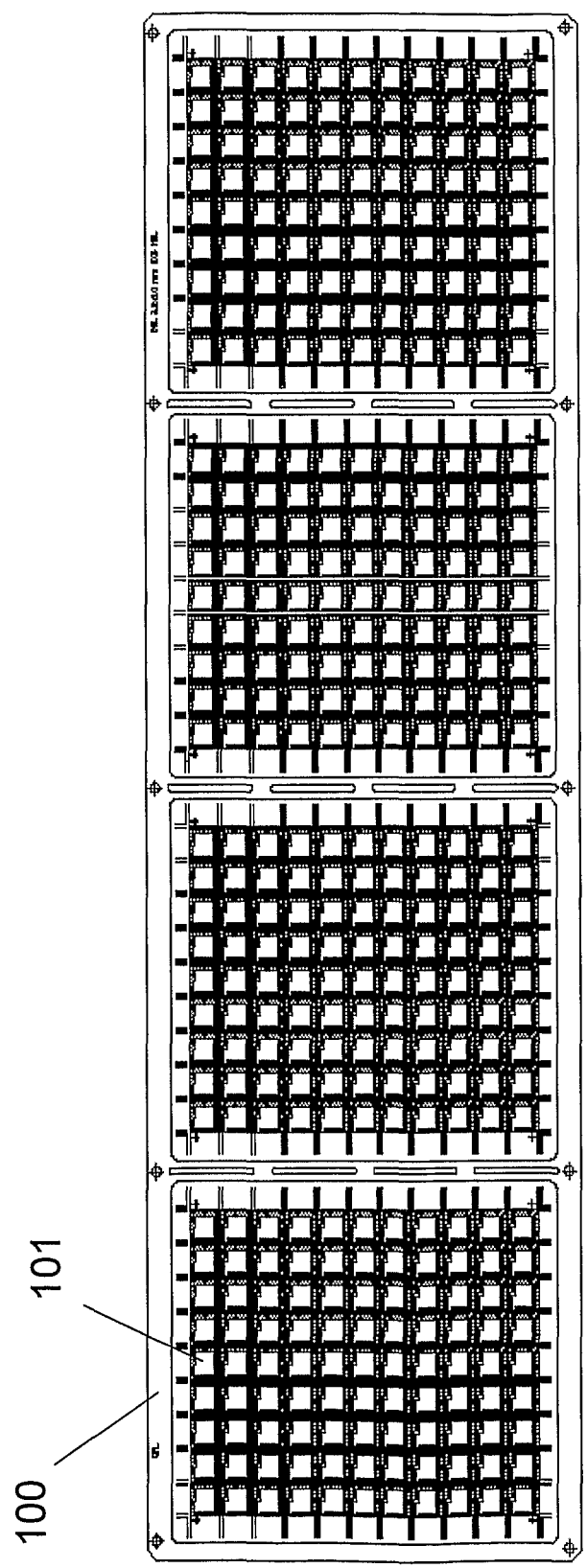
FIG. 1 illustrates an embodiment of a leadframe strip for use in an IC package manufacturing process.

Referring now to FIG. 1, a metal strip 100, for example, of the type that may be used in an IC package manufacturing process, is shown. The metal strip 100 includes a plurality of device areas 101 disposed thereon. In some embodiments, the metal strip 100 may be copper or other metal or metal alloy and may have a thickness of 5 mils, more than 5 mils, or less than 5 mils. In various embodiments, the device areas 101 may vary in size and the number of device areas 101 on a metal strip 100 may also be varied. For example, in some embodiments, the number of device areas 101 on a metal strip 100 may be any number from less than 100 to more than 1000. During an IC manufacturing process, one or more IC chips may be attached to each device area 101 and encapsulated within an encapsulation compound. In various embodiments, the IC chips may be electrically coupled to the device area 101 via wire bonds or directly thereto in a flip-chip configuration. The IC manufacturing process may also include singulating the device areas 101 from each other to form a plurality of IC packages that may be configured to be mounted to an external device, such as a PCB. When the IC packages are mounted onto a PCB, the IC chips may be electrically coupled to the PCB via contact areas disposed on a bottom surface of the IC packages.

Referring now to FIGS. 2A-2E, aspects of an embodiment of an IC package are shown at various stages of a manufacturing process. For descriptive purposes, the manufacturing process is described relative to a single IC package, but in various embodiments, the steps of the manufacturing process may be applied to some or all of a plurality of device areas of a leadframe strip, such as the metal strip 100 shown in FIG. 1. Referring now to FIG. 2A, the process begins with an unetched leadframe 200, such as a device area of a metal strip. In FIG. 2B, the leadframe 200 has been partially etched to form a pattern of recesses 226 defining metal traces 222 on a top surface thereof. In the embodiment shown, a metal plating has been added to bonding areas 218 disposed on a top surface of the metal traces 222. The metal plating of the bonding areas 218 may be formed by applying a bondable or solderable material to the metal traces 222, such as, for example, a plated or clad metal such as silver (Ag), gold (Au), tin (Sn), copper (Cu), or other bondable materials. In some embodiments, portions of a bottom surface of the metal traces 222 may be coated with a solderable material, such as, for example, metal plating. As will be described in more detail below, areas of the bottom surface that will later become contact pads 206 have been plated in this embodiment. In FIG. 2C, an IC chip 204 has been secured to the top surface of the leadframe 200 using an adhesive material, for example, an epoxy, electrically coupled to the bonding areas 218, for example via wire bonds 214, and an encapsulation compound 208 (shown as shaded areas) has been applied to encapsulate the IC chip 204 and the wire bonds 214. In addition, the encapsulation compound 208 has also filled in the recesses 226, including the recesses 226 disposed under the IC chip 204.

In FIG. 2D, a bottom surface of the leadframe 200 has been etched away. In the embodiment shown, the leadframe 200 has been etched across the entire bottom surface thereof to remove a portion 200a thereof. In various embodiments, a subset of the entire bottom surface may be etched away. As can be seen in FIG. 2D as compared to FIG. 2C, the thickness of the leadframe has been reduced. As will be described in more detail below, by reducing the thickness of the leadframe 200 across an entire bottom surface therefrom, less material will be need to be etched away during later partial or patterned etchings, if any, which may reduce undercutting thereby improving electrical connectivity and, in some embodiment, may allow thinner contact pads to be formed. For example, in some embodiments, the leadframe 200 may have a thickness of on the order of 4 mils and the thickness may be reduced by on the order of 1 mil or more.

Referring now to FIG. 2E, the bottom surface of the leadframe 200 has been partially etched to form a pattern therein. In various embodiments, contact pads 206 disposed on the bottom surface of the leadframe 200 may be plated with a metal plating. In various embodiments, the etching of the bottom surface may include etching portions 226a of the leadframe 200 corresponding to the recesses 226 that were formed in a top surface of the leadframe 200 to completely etch through the leadframe 200 at those areas and, in some places, expose a bottom surface of the encapsulation compound 208. In various embodiments, the etching may include removing areas 222a of some of the metal traces 222 in addition to areas the portions 226a of the leadframe 200 between the metal traces 222 below the recesses 226. In some embodiments, a protective coating 229 may be added to a portion of bottom surfaces of the metal traces 222.

Referring now to FIG. 3A, a top view of a leadframe 300 is shown before an IC chip has been mounted thereon. In the embodiment shown, the leadframe 300 has a plurality of recesses 326 (shown as unshaded portions) etched into a top surface thereof, where the recesses 326 form a plurality of metal traces 322 (shown as shaded portions) on the top surface of the leadframe 300. The metal traces 322 may be formed having any width of any size, such as, for example, in some embodiments the width of the metal traces 322 may be on the order of 1.5 mils and they may be spaced apart on the order of 4 mils from each other. Although an embodiment is shown having a particular pattern, any number of patterns may be etched into the leadframe 300. Bonding areas 318 for wire bonding to an IC chip may include portions of the metal traces 322 around the periphery of the leadframe 300 and may include metal plating thereon (not shown). For descriptive purposes, the location of the contact pads 306 disposed on a bottom surface of the leadframe 300 for electrically coupling an IC chip to corresponding contact points on a PCB have been shown as unshaded squares disposed at an opposite end of the metal traces 322 from the bonding areas 318. Some of the un-etched portions of the leadframe 300 between the recesses 326 may be used to provide support for the IC chip that may be mounted thereon and/or provide electrical pathways to route signals between the bonding areas 318 on a top surface of the leadframe 300 and contact pads 306 on a bottom surface of the leadframe 300. While all of the contact pads 306 are shown interiorly disposed relative to the bonding areas 318, some or all of the contact pads 306 may be disposed directly below the bonding areas 318 or may be disposed outwardly from the bonding areas 318 towards a periphery of the leadframe 300.

FIG. 3B is a side view of a magnified cross section of the portion of leadframe 300 from Detail A of FIG. 3A. From this view, recesses 326 formed into a top surface of the leadframe 300 can be seen with the metal traces 322 and bonding areas 318 being disposed therebetween. While the recesses 326 are shown having a certain depth and width, in various embodiments, the recesses 326 may be of any depth and any width depending on the design criteria. In various embodiments, when bonding areas 318 and metal traces 322 are formed by partially etching a pattern in the top surface of leadframe 300, undercutting may occur where portions 322a of the sides of the metal traces 322 are removed thereby making portions of the metal trace 322 below the upper surface narrower than the upper surface.

Figure 4A:
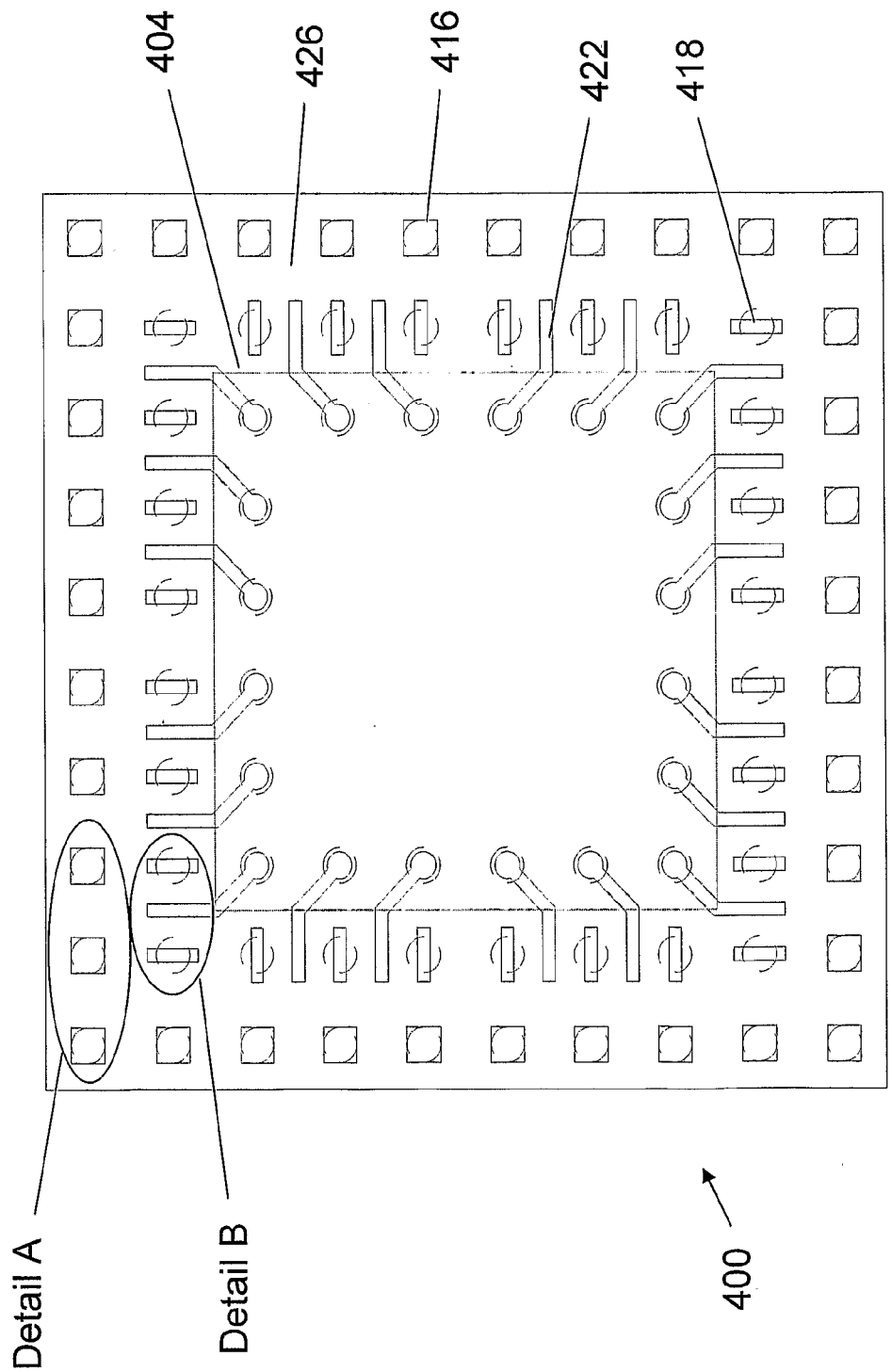
FIGS. 4A-B are top views of embodiments of two leadframes having two rows of bonding areas around a periphery thereof.

Referring now to FIG. 4A, a top view of an embodiment of a leadframe 400 having a pattern etched into a top surface thereof is shown. For descriptive purposes, an outline of an IC chip 404 mounted thereon is shown. In this embodiment, recesses 426 have been formed by etching away portions of a top surface of the leadframe 400 to define bonding areas 416 and 418 and metal traces 422. In the embodiment shown, the die-attach area (DA area) is the portion of the leadframe underneath the area where the IC chip 404 will be mounted and may include both a die-attach pad and portions of the metal traces 422.

Still referring to FIG. 4A, for descriptive purposes, an outline of the areas where contact areas may be disposed on a bottom surface of the leadframe 400 during an etching step are shown as circles having dashed-lines. As can be seen, the top surface of leadframe 400 has been partially etched such that two rows of bonding areas 416 and 418 have been formed. In the embodiment shown, the size and shape of the inner row of bonding areas 418 is different than the size and shape of the outer row of bonding areas 416. In the embodiment shown, no metal traces are coupled to the outer row of bonding areas 416 because, as can be seen, the bonding areas 416 are disposed directly over the contact pads. In this orientation, the centerlines of the bonding areas 416 must be spaced apart the same distance as the distance between the centerlines of the contact pads. However, in the inner row, the bonding areas 418 have been spaced closer together because some of the contact pads are not disposed directly underneath corresponding bonding areas 418.

Figure 4B:
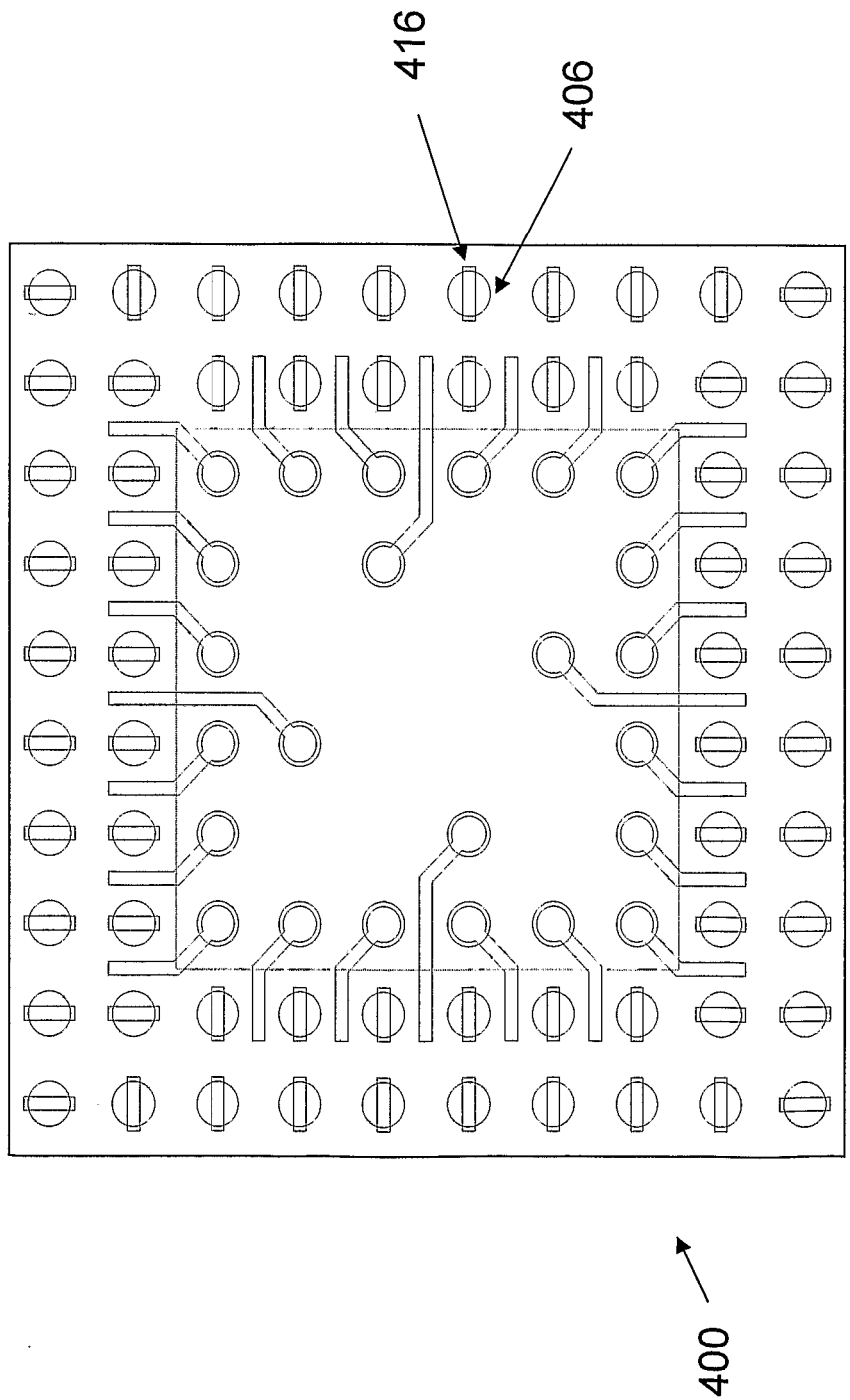

Referring now to FIG. 4B, an alternative embodiment of the leadframe 400 of FIG. 4A is shown. In this embodiment, the outer row of bonding areas 416 have been formed to be substantially smaller than the contact pads 406 shown as being disposed directly therebelow.

Referring now to FIG. 5, cross-sectional side views corresponding to Detail A and Detail B of FIG. 4A are shown at various stages of a manufacturing process. At step s501, an etch-resist material is selectively applied to a top surface of the metal leadframe 500 and recesses 526 has been partially etched into the top surface of the leadframe 500 to form a pattern therein. In some embodiments, the etch-resist coating may be selectively applied to both top and bottom surfaces of the leadframe 500, as shown relative to bonding areas 516. In some embodiments, the etch-resist coating may be a metal plating or a metal plating may be applied after the recesses 526 have been formed. At step s503, the top surface of the leadframe 500 has been covered with an encapsulation compound 508. In various embodiments, wire bonds (not shown) may be bonded to the bonding areas 516 and 518 before the encapsulation compound 508 is applied. At step s505, a bottom surface of the leadframe 500 has been partially etched to remove certain portions thereof to define contact pads 506 therein having sidewalls 506a. As can be seen, etching the bottom surface of the leadframe 500 to define the contact areas 506 results in portions of the sidewalls 506a thereof being etched away or undercut.

Still referring to FIG. 5, the side views corresponding to Detail A show the contact pads 506 being disposed directly below the bonding areas 516, both having substantially the same diameter. Oftentimes, PCB mounting requirements dictate the minimum diameter of the contact areas 506 and the distance they must be spaced apart (pitch). Disposing contact areas 506 directly below corresponding bonding areas 516 thus requires the bonding areas 516 to meet those same PCB limitations. By contrast, the side views corresponding to Detail B show the two outer contact pads 506 being disposed below bonding areas 518a while the contact pad (not shown) corresponding to the bonding area 518b is remotely disposed therefrom and coupled thereto via metal trace 522. By remotely disposing the contact pad corresponding to bonding area 518b, the bonding areas 518a and 518b may have a smaller width and be spaced closer together than the boding areas 516 shown in Detail A while still meeting the PCB spacing requirements for the corresponding contact pads 506. For example, in some embodiments, the bonding areas 518a and 518b may have a width on the order of 2.5 mils and may be spaced apart on the order of 4 mils while the contact pads 506 may have a diameter of on the order of 6 mils and spaced apart on the order of 4 mils or more.

Figures 6A, 6B:
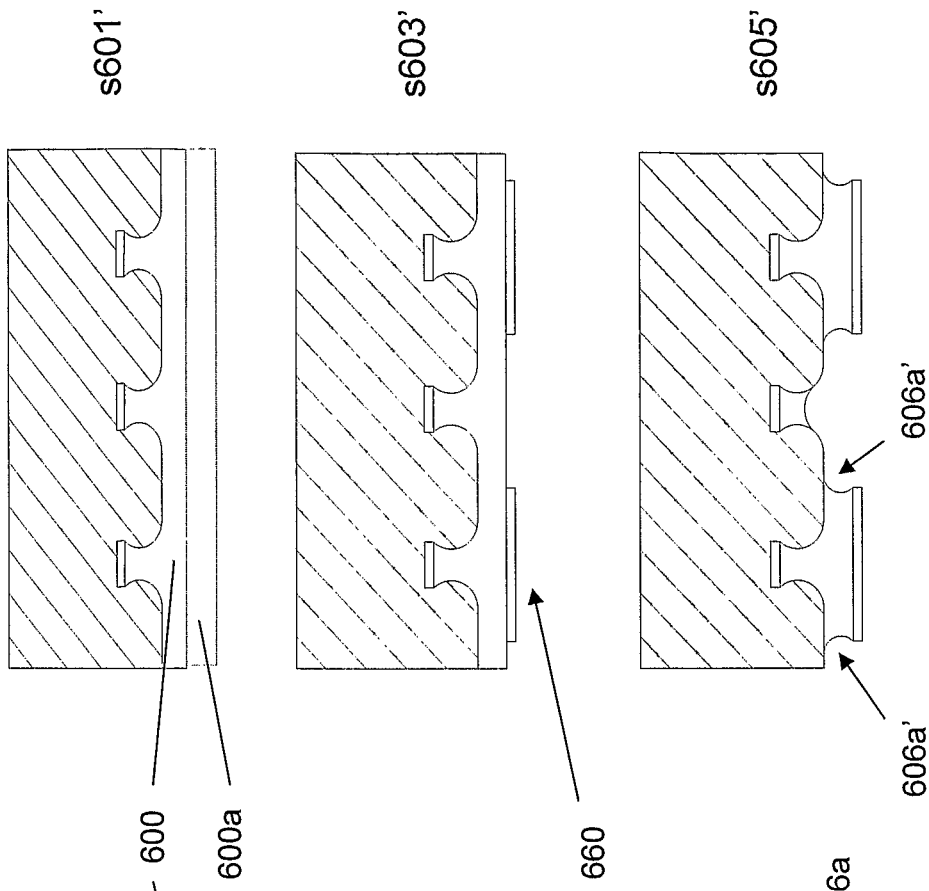
FIGS. 6A and 6B illustrate side views of various aspects of an embodiment of an IC package at various stages of two manufacturing processes.

Referring now to FIGS. 6A and 6B, side views of an IC package at various stages of two different IC package manufacturing processes are shown. Referring now to FIG. 6A, at step s601, a side view of leadframe 600 is shown having a plurality of recesses in a top surface thereof defining a plurality of bonding areas thereon and having an encapsulation layer added thereto. At step s603, a coating 660 has been selectively applied to the bottom surface of the leadframe 600, such as, for example, a metal plating, an etch-resist coating, or other material. At step s605, the bottom surface of the leadframe 600 has been partially etched to form recesses therein corresponding to the portions not having the selective coating 660 thereon. In the embodiment shown, the recesses define a plurality of contact pads having sidewalls 606a, where the partial etching causes an etched undercut into the side walls 606a. In various embodiments, the thicker the leadframe 600, the deeper the undercut will extend into the sidewalls 606a of the contact pads.

Referring now to FIG. 6B, at step s601', a side view of leadframe 600 is shown having a plurality of recesses in a top surface thereof defining a plurality of bonding areas thereon and having an encapsulation layer added thereto. In the embodiment shown, a bottom portion 600a of the leadframe 600 has been removed, thereby reducing the thickness of the leadframe 600 from a first amount to a second amount. In various embodiments, the bottom portion 600a may be removed via a mechanical or chemical etching or milling process. At step s603', a coating 660 has been selectively applied to the bottom surface of the leadframe 600, such as, for example, a metal plating, an etch-resist coating, or other material. At step s605', the bottom surface of the leadframe 600 has been partially etched to remove the portions of the leadframe 600 not covered by the selective coating 660 thereby forming recesses into the leadframe 600. In the embodiment shown, the recesses define a plurality of contact pads having sidewalls 606a', where the partial etching causes an etched undercut into the side walls 606a'. As can be seen, because the portion 600a was removed from the bottom surface of the leadframe 600, the amount of undercutting of the sidewalls 606a' has been reduced relative to the undercutting shown in FIG. 6A.

Figure 7A:
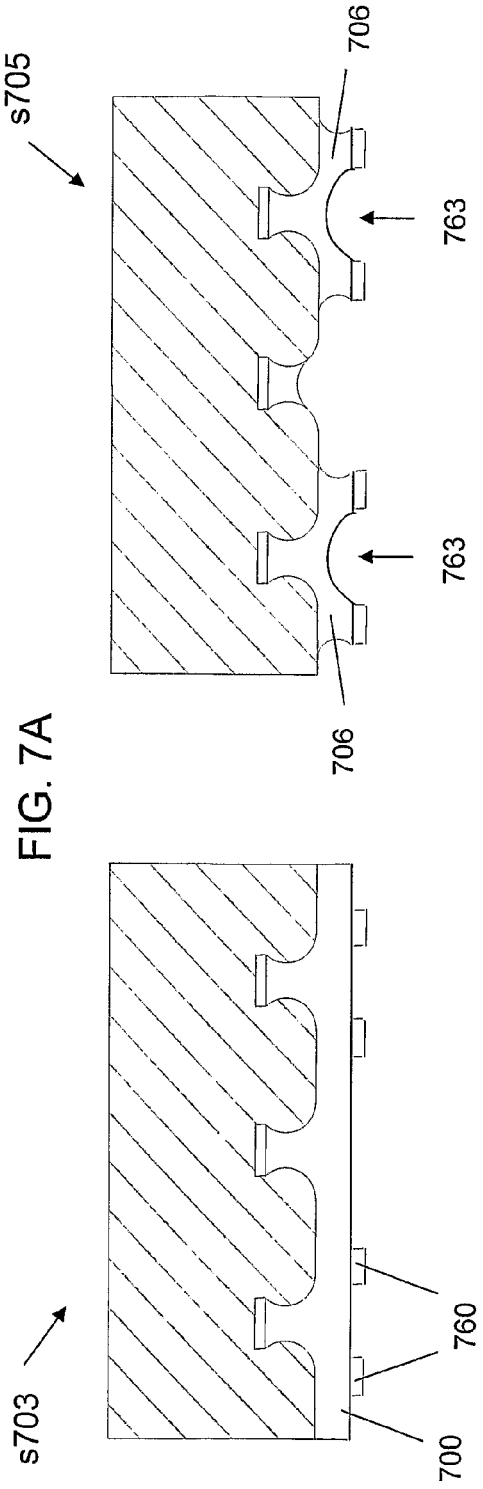
FIGS. 7A-B illustrate side views of various aspects of an embodiment of an IC package at various stages of a manufacturing process for patterning a contact pad.

Referring now to FIG. 7A, cross-sectional side views of a metal leadframe 700 at various stages of a manufacturing process are shown. At step s703, a metal coating 760 has been selectively applied to a bottom surface of the metal leadframe 700. At step s705, the bottom surface of the metal leadframe 700 has been partially etched to define contact pads 706 each having a pattern formed in a bottom surface thereof. In the embodiment shown, the contact pads 706 each have an indentation 763 formed therein, the indentation 763 being a generally parabolic-shaped concavity.

Figure 7B:
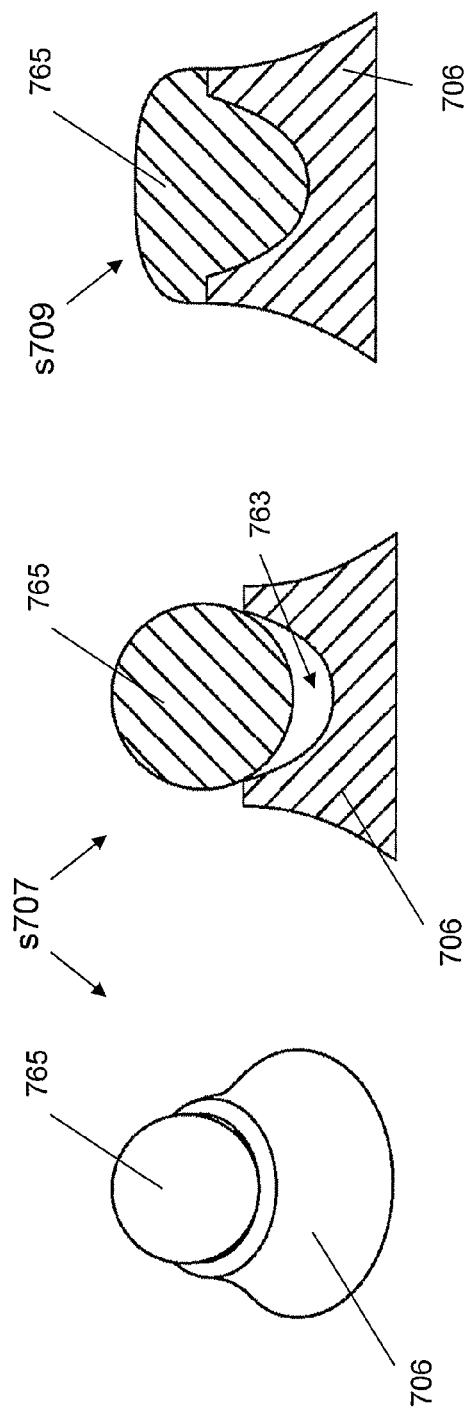

Referring now to FIG. 7B, one of the contact pads 706 of FIG. 7A is described in more detail. At step s707, a perspective view and a side view of a contact area 706 is shown having a soldering agent 765 (shown as a solder ball for descriptive purposes) disposed relative thereto. In various embodiments, the soldering agent 765 may be applied using a solder silk-screen printing method, solder dip, solder paste, solder ball, or other solder finishing process. As can be seen, the indentation 763 in the bottom surface of the contact pad 706 may be adapted to provide an increased surface area for bonding with the soldering agent 765. In various embodiments, the soldering agent 765 may be a solder ball, solder wire, solder paste, or other attachment materials. At step s709, the soldering agent 765 has been bonded to the surface of the indentation 763 of the contact pad 706. In some embodiments, the soldering agent 765 may be applied to the contact pad 706 prior to mounting to a PCB or during the mounting process.

Referring now to FIG. 8A, cross-sectional side views of a metal leadframe 800 at various stages of a manufacturing process are shown. At step s803, a metal coating 860 has been selectively applied to a bottom surface of the metal leadframe 800. At step s805, the bottom surface of the metal leadframe 800 has been selectively etched to define contact pads 806 each having a pattern formed in a bottom surface thereof. In the embodiment shown, the contact pads 806 each have a plurality of indentations 863 formed therein.

Referring now to FIG. 8B, one of the contact pads 806 of FIG. 8A is described in more detail. At step s807, a perspective view of the contact pad 806 is shown having a soldering agent 865 disposed relative thereto. As can be seen in this embodiment, the bottom of the contact pad 806 includes a ring-shaped channel indentation 863b surrounding a dimple-shaped indentation 863a. At step s809, the soldering agent 865 has been melted to conform to the indentations 863 of the contact pad 806. In various embodiments, having a plurality of indentations 863 provides an increased surface area of contact between the contact pad 806 and the soldering agent 865.

Figure 9:
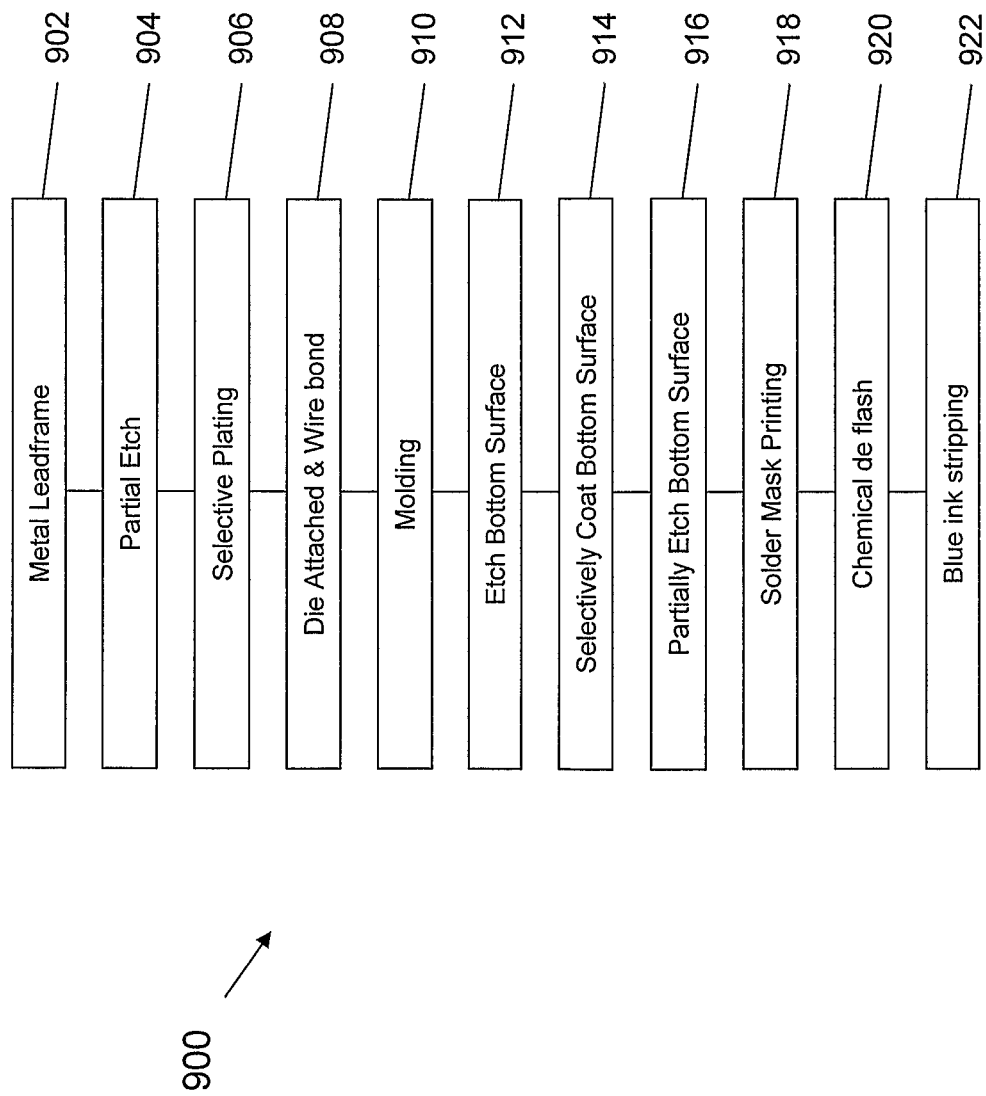
FIG. 9 is a flowchart of an embodiment of a process for manufacturing an IC package.

Referring now to FIG. 9, a flow chart of an embodiment of an IC package manufacturing process 900 is shown. The process begins at step 902 with an unetched leadframe, such as, for example, a metal strip of copper. At step 904, the leadframe is partially etched on a top surface to create recesses therein defining metal traces thereon. The partial etching may be carried out by any number of etching processes, such as, for example, coating or laminating a top surfaces of the leadframe with a layer of photo-imageable etch resist such as a photo-imageable epoxy. For example, the photo resist may be spin-coated onto the leadframe, then exposed to ultraviolet light using a photo-tool, wherein the exposed portions are then removed in a development process. The etch resist is thereby patterned to provide the recesses on the top surface of the leadframe. The leadframe is then etched, for example by immersion or pressurized spray, to partially pattern the metal traces. In some embodiments, the etch may be a half-etch, such that the recessed formed in the leadframe extend halfway therethrough. For example, in a 4 mil leadframe, the half-etch would be a 2 mil etch. In various embodiments, the leadframe may be etched more or less than halfway therethrough. For example, in some embodiments, the partial etching may be to a depth on the order of 3 mils +/−0.5 mils. After etching, the etch resist may be stripped away.

At step 906, the partially etched leadframe may be selectively plated, such as, for example, by plating the bonding areas on a top surface thereof. The metal plating of the bonding areas may be formed by applying a bondable material to the metal traces. In various embodiments, a surface adhesion enhancement treatment ("AE treatment"), such as, for example, roughening and/or cleaning the surface to increase adhesion, may follow the metal plating.

At step 908, an IC chip is mounted to the leadframe using an adhesive material, for example, an epoxy. After the IC chip is mounted to the leadframe, the IC chip may be electrically coupled to the bonding areas disposed outside of the die-attach area, for example, via wire bonds. In various embodiments, a flip-chip configuration may be utilized and wire bonding may not be required. Thereafter, a molding compound is applied to encapsulate the IC chip and the wire bonds at step 910. At step 912, a bottom surface of the leadframe is etched. In some embodiments, no etching is done at step 912. In some embodiments, the leadframe is etched across the entire bottom surface thereof thereby reducing the thickness of the leadframe. By reducing the thickness of the leadframe across an entire bottom surface thereof, there is less material needing to be etched away during later partial or patterned etchings, if any, thereby reducing undercutting. In various embodiments, at step 912 only a subset rather than the entire bottom surface may be back etched, such as, for example, in a pre-determined pattern.

In various embodiments, the process 900 may end after step 912. In some embodiments, the process 900 proceeds to step 914. In some embodiments, a full metal plating is applied to the bottom surface of the leadframe before the process 900 proceeds to step 914. At step 914, the bottom surface of the leadframe is selectively coated with a material. In some embodiments, the coating material may be a solder mask printed on a bottom surface of the leadframe. After the solder mask is exposed and developed, the process 900 may end. In some embodiments, the coating material may be an etch-resist applied to the bottom surface of the leadframe, such as, for example, a blue-ink printing to transfer an image of a pattern to be etched with an etchant, such as, for example, $FeCl_3$. In some embodiments, the coating material is a metal plating, such as, for example, a NiPdAu plating, applied to a bottom surface of the leadframe after step 912. In some embodiments, the process 900 may end after the metal plating, may proceed to the solder mask printing step described above, or may proceed to the etch-resist step described above.

In some embodiments, after the bottom surface of the leadframe has been coated with a material, the process 900 proceeds to step 916. At step 916, the bottom surface of the leadframe is partially etched to form a pattern therein. In embodiments where a metal plating has been selectively applied to a bottom surface of the leadframe, an etch-resist may not be needed, may not need to be applied over the metal plating, or may be applied over the metal plating. After the partial etching, a "de bleed" step may be performed to remove blue-ink overhang, if any. In some embodiments, blue ink, if applied, may be left on the metal plating or may be added to the metal plating to protect the metal plating from later processing steps. In various embodiments, the back etching of the bottom surface may include etching portions of the leadframe corresponding to the recesses that were formed in a top surface of the leadframe to thereby completely etch through the leadframe at those areas and thereby exposing a bottom surface of the encapsulation compound. In various embodiments, the back etching may include removing areas of some of the metal traces in addition to areas of the leadframe between the metal traces. In various embodiments, the back etching may be repeated a plurality of times, as may be needed for certain design criteria.

In some embodiments, a protective coating may be added to a portion of bottom surfaces of the leadframe. For example, in some embodiments, at step 918, a solder mask may be printed onto portions of a bottom surface of the metal traces to cover exposed portions thereof. Thereafter, the process 900 may include a chemical de flashing at step 920 to remove any solder resist on the contact areas while leaving the solder resist on exposed metal traces. The solder resist may then be cured, for example, via UV curing so the solder resist will resist solder and chemicals. At step 922, remaining blue ink, if any, may then be stripped to expose the areas of the contact surfaces for further surface mounting treatments, if any.

Referring now to FIG. 10, a flow chart of an alternative embodiment of the IC package manufacturing process 900 of FIG. 9 is shown. Similar to the process of FIG. 9, the IC manufacturing process 1000 of the embodiment shown begins at step 1002 with an unetched leadframe followed by a partial etching at step 1004. At step 1006, the partially etched leadframe may be selectively plated on both a top and bottom surface thereof. Next, at step 1008, an IC chip is mounted to the leadframe and electrically coupled thereto. Thereafter, an molding compound is applied to encapsulate the IC chip and the wire bonds at step 1010. At step 1012, a bottom surface of the leadframe is partially etched. In various embodiments, at step 1014, a water jet or other abrasive process may be applied to a bottom surface of the leadframe.

In various embodiments, the process 1000 may end after step 1014. In some embodiments, the process 1000 proceeds to step 1016 and a solder mask is printed thereon, whereas in other embodiments, the process 1000 may proceed to step 1016' and an etch resist may be applied. From step 1016, various embodiments of the process 1000 may include a chemical de flash (step 1018), a UV curing (step 1020), and/or a blue ink stripping (step 1022) similar to the steps described above in FIG. 9. From step 1016', various embodiments of the process 1000 may include a solder mask printing (step 1018'), exposure (step 1020'), and/or development (step 1022') similar to the steps described above in FIG. 9.

Although various embodiments of the method and system of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth herein.

The invention claimed is:

1. A method of forming an IC package, the method comprising:
   providing a metal leadframe formed of a material and having a thickness of a first value;
   patterning a top surface of the metal leadframe to form recesses therein, the top surface recesses defining upper portions of a plurality of bonding areas;
   selectively plating the top surface;
   mounting an IC chip onto the top surface;
   electrically coupling the IC chip to the plurality of bonding areas;
   encapsulating the IC chip in an encapsulation compound;
   after encapsulating, reducing the overall thickness of the metal leadframe from the first value to a second value by removing a layer of the material from an entire bottom surface of the metal leadframe to form a new bottom surface thereon;
   selectively masking the new bottom surface of the metal leadframe to form a pattern thereon, the pattern defining portions of the metal leadframe to be etched;
   selectively etching the portions of the metal leadframe to form recesses in the new bottom surface thereof, the bottom surface recesses defining a plurality of contact pads having side walls relative to the new bottom surface of the leadframe with etched undercut therein; and
   wherein by reducing the overall thickness of the metal leadframe to the second value, the depth of the undercutting is reduced.

2. The method of claim 1, wherein the selectively etching forms a plurality of indentations into bottom surfaces of the plurality of contact pads.

3. The method of claim 2, wherein the selectively etching forms at least one ring-shaped channel encircling at least one indentation of the plurality of indentations.

4. The method of claim 2 and further comprising:
   applying an electrically conductive solderable material to the plurality of indentations.

5. The method of claim 1, wherein the first value of thickness of the metal leadframe is less than on the order of 5 mils.

6. The method of claim 1, wherein the difference between the first value and the second value is greater than on the order of 1 mil.

7. A method of patterning a bottom surface of an integrated circuit (IC) package of the type having an IC chip mounted to a metal leadframe and electrically coupled to bonding areas disposed on a top surface of the metal leadframe, the IC chip being encapsulated in an encapsulation compound, the method comprising:
   providing a metal leadframe having recesses in a top surface thereof, the recesses being at least partially filled by an encapsulation compound;
   after the recesses have been at least partially filled by an encapsulation compound, reducing a thickness of the metal leadframe by removing a layer of metal from an entire bottom surface of the metal leadframe to expose a new bottom surface thereof;
   applying an etch-resist material to the new bottom surface of the metal leadframe to form a pattern thereon defining portions of the metal leadframe to be etched;
   selectively etching the portions of the metal leadframe defined by the pattern to electrically isolate a plurality of contact pads and form indentations in bottom surfaces of the plurality of contact pads, the plurality of contact pads having sidewalls with etched undercut therein; and
   wherein by removing the layer of metal from the entire bottom surface of the metal leadframe, the depth of the etched undercut in the sidewalls is reduced.

8. The method of claim 7, wherein at least one contact pad of the plurality of contact pads has a ring-shaped channel etched into the bottom surface thereof and encircling the indentation.

9. The method of claim 7, wherein the indentation etched into at least one of the contact pads is a generally parabolic-shaped concavity.

10. A method of patterning a bottom surface of an integrated circuit (IC) package of the type having an IC chip mounted to a metal leadframe and electrically coupled to bonding areas disposed on a top surface of the metal leadframe, the IC chip being encapsulated in an encapsulation compound, the method comprising:
    providing an IC package having an IC chip mounted to a top surface of a metal leadframe and encapsulated in an encapsulation compound, the metal leadframe having a substantially flat bottom surface;
    removing the entire bottom surface of the metal leadframe of the IC package to expose a new bottom surface, the new bottom surface being substantially flat;
    applying an etch-resist layer to the new bottom surface of the metal leadframe of the IC package to form a pattern thereon defining portions of the metal leadframe to be etched;
    selectively etching the portions of the metal leadframe defined by the pattern to electrically isolate a plurality of contact pads and form indentations in bottom surfaces of the plurality of contact pads; and
    applying an electrically conductive solderable material to the bottom surface of the plurality of contact pads.

11. The method of claim 10 and further comprising:
    wherein the removing the entire bottom surface of the metal leadframe reduces a thickness of the metal leadframe by approximately 1 mil.

12. The method of claim 10, wherein applying the etch-resist layer includes applying a metal plating.

13. The method of claim 10, wherein applying the etch-resist includes forming at least one ring of etch-resist having an outer perimeter and an inner perimeter.

14. The method of claim 13, wherein the selective etching forms an outer edge of a contact pad of the plurality of contact pads defined by the outer perimeter of the ring and forms an indentation bounded by the inner perimeter of the ring.

15. The method of claim 13, wherein the outer perimeter and the inner perimeter are circumferences.

16. The method of claim 10, wherein applying the etch-resist includes forming an inner ring of etch resist and an outer ring of etch resist concentric with the at least one inner ring.

17. The method of claim 16, wherein the selective etching forms an outer edge of a contact pad of the plurality of contact pads defined by an outer perimeter of the outer ring, an indentation defined by an inner perimeter of the inner ring, and a ring-shaped channel defined by an area between the inner ring and the outer ring.

18. The method of claim 10 and further comprising:
singulating the IC package from a strip of IC packages.

* * * * *